United States Patent
Wang et al.

(10) Patent No.: US 10,565,347 B2
(45) Date of Patent: Feb. 18, 2020

(54) GLOBAL ROUTING OPTIMIZATION

(71) Applicant: International Business Machines Corporation, Armonk, NY (US)

(72) Inventors: You Hang Wang, Shanghai (CN); Xu Yue, Shanghai (CN); Wen Yin, Shanghai (CN)

(73) Assignee: International Business Machines Corporation, Armonk, NY (US)

( * ) Notice: Subject to any disclaimer, the term of this patent is extended or adjusted under 35 U.S.C. 154(b) by 100 days.

(21) Appl. No.: 15/940,485

(22) Filed: Mar. 29, 2018

(65) Prior Publication Data
US 2019/0303526 A1 Oct. 3, 2019

(51) Int. Cl.
*G06F 17/50* (2006.01)
(52) U.S. Cl.
CPC ...... *G06F 17/5077* (2013.01); *G06F 17/5081* (2013.01)
(58) Field of Classification Search
CPC .......................... G06F 17/5077; G06F 17/5081
USPC ........................................................ 716/129
See application file for complete search history.

(56) References Cited

U.S. PATENT DOCUMENTS

| | | | |
|---|---|---|---|
| 6,145,117 A * | 11/2000 | Eng | G06F 17/5045 716/105 |
| 7,137,097 B1 | 11/2006 | Aji et al. | |
| 7,634,751 B2 * | 12/2009 | Ueda | G06F 17/5077 716/110 |
| 8,230,378 B2 | 7/2012 | Cohn et al. | |
| 8,751,989 B1 | 6/2014 | Harrer et al. | |
| 10,120,970 B2 * | 11/2018 | Mueller et al. | G06F 17/5077 |
| 2004/0230924 A1 | 11/2004 | Williams et al. | |

OTHER PUBLICATIONS

Jin Hu, "High-performance Global Routing for Trillion-gate Systems-on-Chips," A dissertation submitted in partial fulfillment of the requirements for the degree of Doctor of Philosophy (Computer Science and Engineering) in the University of Michigan, 2013, 156 pages.

* cited by examiner

*Primary Examiner* — Sun J Lin
(74) *Attorney, Agent, or Firm* — Patterson + Sheridan, LLP (57) ABSTRACT

Method and apparatus for global routing optimization are provided herein. Optimizing global routing of a circuit, includes recursively generating, in parallel, a plurality of candidate wiring layouts for an integrated circuit, wherein each candidate wiring layout of the plurality of candidate wiring layouts corresponds to a respective parameter super-group of a plurality of parameter super-groups, wherein the plurality of parameter super-groups form a parameter set; calculating a Quality of Result (QoR) measure for each candidate wiring layout in an iteration; combining selected parameter super-groups of the iteration, based on the QoR measure, to form a new plurality of parameter super-groups for a next iteration; and determining a best parameter super-group from the parameter sets for use in globally routing the circuit.

20 Claims, 4 Drawing Sheets

GLOBAL ROUTING OPTIMIZATION

BACKGROUND

The present invention relates to integrated circuit design, and more specifically, to global trace routing. In the design of integrated circuits, the three dimensional layout of a circuit may involve positioning millions of individual elements and routing connections between those elements. Routing is often broken into three hierarchical stages: global routing, track routing, and detail routing. Global routing determines the approximate paths for a net of interconnections between elements (also referred to as "wires" or "wiring") in the presence of localized congestion (e.g., due to wires, components, or boundaries of the integrated circuit). Track routing uses the layout produced by global routing and attempts to validly assign wiring to components on specific layers of the circuit (e.g., not passing wires through each other or other elements). Finally, detail routing uses the track routing and attempts to connect all of the terminals through exact and legal routing structures.

SUMMARY

According to one embodiment of the present invention, a method is provided for optimizing global routing of a circuit, comprising: generating, in parallel, a plurality of candidate wiring layouts for an integrated circuit, wherein each of the candidate wiring layouts corresponds to a respective one of a plurality of parameter super-groups, wherein the plurality of parameter super-groups form a parameter set; calculating a Quality of Result (QoR) measure for each candidate wiring layout of the plurality of candidate wiring layouts based on metrics associated with each candidate wiring layout; in response to determining to perform a subsequent iteration of a series of iterations: updating the parameter set by combining selected parameter super-groups of the plurality or parameter super-groups, based on the QoR measure, to form a plurality of new parameter super-groups; and generating, in parallel, a plurality of new candidate wiring layouts for the integrated circuit, wherein each of the new candidate wiring layouts corresponds to a respective one of the plurality of new parameter super-groups; calculating a new QoR measure for each new candidate wiring layout of the plurality of new candidate wiring layouts based on metrics associated with each new candidate wiring layout; and in response to determining to not perform any further iterations: determining a best parameter super-group from the parameter set based on the new QoR measure calculated for the plurality of new candidate wiring layouts; and transmitting the new candidate wiring layout associated with the best parameter super-group to a detail routing system.

According to another embodiment of the present invention, is system is provided for optimizing global routing of a circuit, comprising: one or more computer processors; and a computer-readable storage medium having computer-readable program code embodied therewith, the computer-readable program code executable by the one or more computer processors to: generate, in parallel, a plurality of candidate wiring layouts for an integrated circuit, wherein each of the candidate wiring layouts corresponds to a respective one of a plurality of parameter super-groups, wherein the plurality of parameter super-groups form a parameter set; calculate a Quality of Result (QoR) measure for each candidate wiring layout of the plurality of candidate wiring layouts based on metrics associated with each candidate wiring layout; in response to determining to perform a subsequent iteration of a series of iterations: update the parameter set by combining selected parameter super-groups of the plurality of parameter super-groups, based on the QoR measure, to form a plurality of new parameter super-groups; and generate, in parallel, a plurality of new candidate wiring layouts for the integrated circuit, wherein each of the new candidate wiring layouts corresponds to a respective one of the plurality of new parameter super-groups; calculate a new QoR measure for each new candidate wiring layout of the plurality of new candidate wiring layouts based on metrics associated with each new candidate wiring layout; and in response to determining to not perform any further iterations: determine a best parameter super-group from the parameter set based on the new QoR measure calculated for the plurality of new candidate wiring layouts; and transmit the new wiring layout associated with the best parameter super-group to a detail routing system.

According to a further embodiment of the present disclosure, a computer program product is provided for optimizing global routing of a circuit, the computer program product comprising: a computer-readable storage medium having computer-readable program code embodied therewith, the computer-readable program code executable by the one or more computer processors to: generate, in parallel, a plurality of candidate wiring layouts for an integrated circuit, wherein each of the candidate wiring layouts corresponds to a respective one of a plurality of parameter super-groups, wherein the plurality of parameter super-groups form a parameter set; calculate a Quality of Result (QoR) measure for each candidate wiring layout of the plurality of candidate wiring layouts based on metrics associated with each candidate wiring layout; in response to determining to perform a subsequent iteration: update the parameter set by combining selected parameter super-groups of the plurality or parameter super-groups, based on the QoR measure, to form a plurality of new parameter super-groups; and generate, in parallel, a plurality of new candidate wiring layouts for the integrated circuit, wherein each of the new candidate wiring layouts corresponds to a respective one of the plurality of new parameter super-groups; calculate a new QoR measure for each new candidate wiring layout of the plurality of new candidate wiring layouts based on metrics associated with each new candidate wiring layout; and in response to determining to not perform any further iterations: determine a best parameter super-group from the parameter set based on the new QoR measure calculated for the plurality of new candidate wiring layouts; and transmit the new candidate wiring layout associated with the best parameter super-group to a detail routing system.

DETAILED DESCRIPTION

A signal router is a system that determines how to route wires into a wiring layout within a three-dimensional rectilinear grid of an integrated circuit and the elements disposed therein and thereon. Within a signal router, a global router, a track router, and a detail router may be included to perform successively more detailed global routing, track routing, and detail routing of the wiring for the integrated circuit. As the global router provides the highest level routing, improvements to its outputted global route affects the downstream systems routings (e.g., a track and/or detail routing) which are performed later. Typically, the detail routing requires greater expenditure of computing resources to complete than the global routing, sometimes taking more than five times as long to complete and a commensurate use of computing resources. To improve the global route produced and used in the subsequent routings, according to embodiments of the present disclosure, a series of iterative global routings are performed with various sets of parameters that are expanded over the iterations to include greater numbers of parameters that are discovered to result in more efficient global routings. These improvements provide, among their many benefits, reduction in the expenditure of computing resources, faster integrated circuit layout, greater configurability for multiple users, and a more accurate layout of wires at a global level, which allows for less modification at the track and/or detail levels. Other benefits of optimizing the global routing process will be appreciated, and the above technical benefits are given as non-limiting examples of the benefits provided by the present disclosure.

Figure 1:
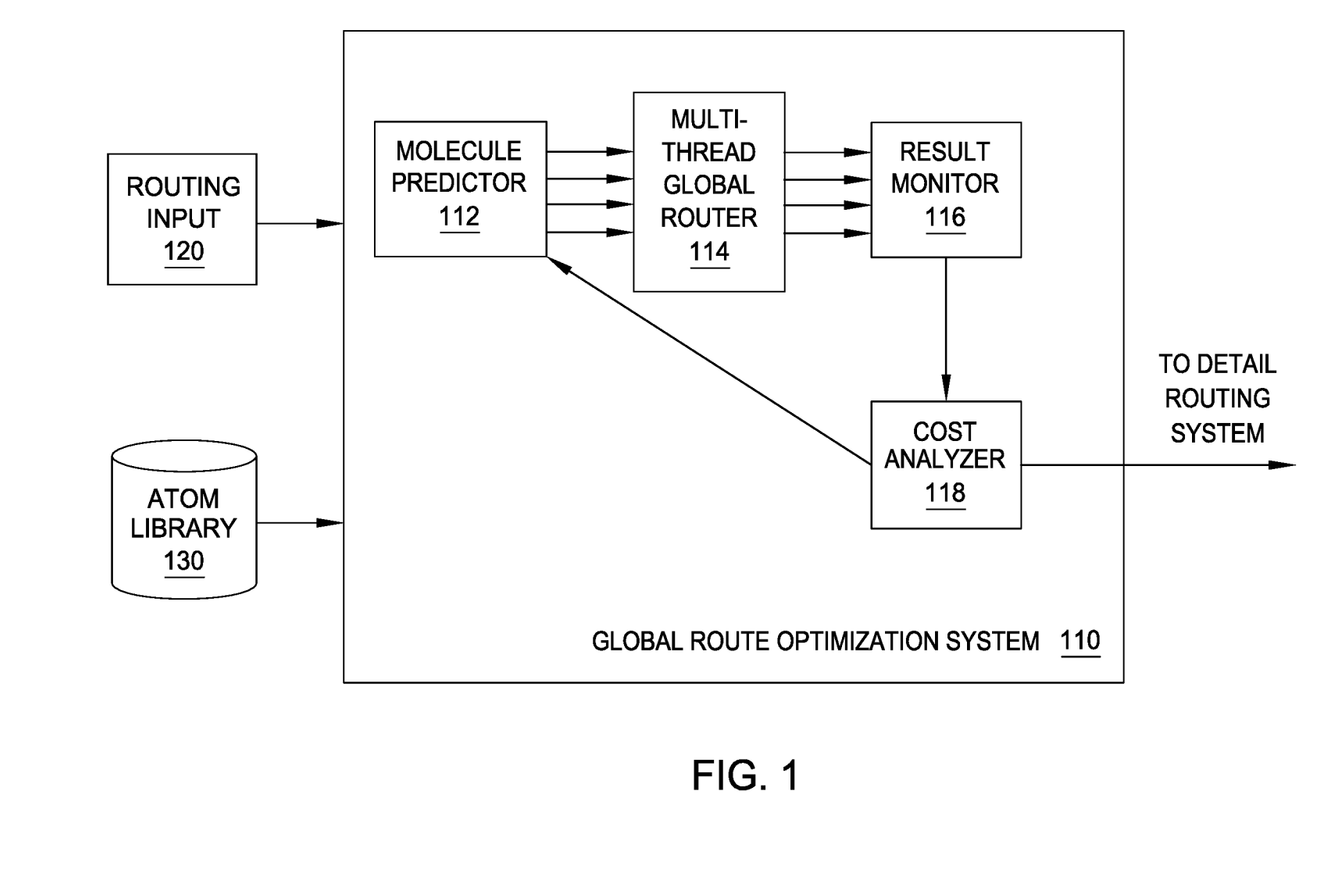
FIG. 1 illustrates an example global route optimization system, in accordance with certain aspects of the present disclosure.

With reference now to FIG. 1, an example Global Route Optimization System (GROS 110) is shown. The GROS 110 as described herein provides improved global routing, which in turn improves the track routing and detail routing processes. The GROS 110 receives routing input 120 and parameters atoms from an atom library 130 as inputs and outputs one or more parameter molecules that represent a best set of parameters for performing global routing in a given integrated circuit and/or the global route of a wiring layout associated with the "best" parameter molecule as determined by the GROS 110. In one embodiment, the GROS 110 routes the wirings for an integrated circuit between the components (e.g., transistors) and elements (e.g., edges, holes) in a three-dimensional rectilinear grid. Depending on the routing input 120 given as inputs, a given layout of an integrated circuit may be different for different users who supply different values in the routing parameters 120; the GROS 110 is configurable to output a "best" molecule or global route based on a user-defined definition of "best".

The routing input 120 may include control parameters selected from a library, a cost function (and a weighting thereof) for evaluating a candidate wiring layout for a global routing scheme, identifiers for atoms to select from the atom library 130, a number of iterations to run the GROS 110 (i.e., an iteration count), a number of parameter atoms or molecules to include in a parameter set in each routing iteration (i.e., a size restriction), a number of parameter atoms or molecules that can be combined from a given iteration for use in a new molecule for the next iteration (i.e., a compound count), and a netlist for the integrated circuit to be globally routed. The control parameters selected from the library may be selected individually and/or as members of a previously defined groups of parameters having certain classifications, such as sub-groups of parameters classified as providing a circuit routing having certain preferred characteristics, such as, for example, a circuit with a timing or high-performance preference, a power level preference, a reliability or ease of manufacturing preference, a timing and power preference, a timing and reliability preference, a power and reliability preference, etc. A control file received from a user specifies which atoms and classified groups of atoms are selected from the atom library 130.

As used herein, a netlist defines the layout of the components and elements of the integrated circuit. As used herein a wiring layout (also referred to as a route or a routing) is the arrangement of wires at the global routing level between the components and elements indicated in the netlist. Several candidate wiring layouts will be generated and evaluated by the GROS 110 in the course of determining the "best" wiring layout and its associated routing parameters. The netlist and the wiring layouts may be defined according to one or more geometric specification languages (e.g., CalTech Intermediate Form) to indicate the relative positions of components, elements, and wires within the three-dimensional rectilinear grids of the integrated circuit.

As used herein, an atom (also referred to as a parameter atom or a parameter group) is a basic grouping of effective parameters for the routing of a circuit. A molecule (also referred to as a parameter molecule or a parameter supergroup) is a collection of one or more atoms (including prior groupings of atoms) that forms a group of routing parameters. The atom library 130 contains a plurality of atoms that a user may specify for use in globally routing a circuit. Example atoms include, but are not limited to: a minimum/maximum number of TSVs, a minimum/maximum proximity of a wire to an element or component, a minimum/maximum proximity of a wire to another wire, a minimum/maximum length of a wire, a minimum/maximum number of layers a wire can pass through, a routing algorithm to use, a global routing cell (gcell) size, a routing effort level (e.g., low, middle, high), a shape division for gcells (e.g., uniform vs. non-uniform), global routing models (e.g., cell congestion, edge congestion), methodology of track assignment (e.g., pin location, center of gcell), global layer density target, wander length control, wander optimization percent, options of passes and threads, etc. As will be appreciated, the configuration of a global router can require a very complex configuration using hundreds of parameter atoms or combinations thereof that may be specified for selection in the routing input 120 and the preceding examples are given as non-limiting examples of the myriad parameters that can be specified in atoms and collected into molecules.

As used herein, a cost (also referred to as the cost of routing or a Quality of Results (QoR) measure) is a weighted linear combination of one or more metrics that are set according the user's goal or definition of what entails the "best" wiring layout. The cost may be defined in a user-supplied cost function in the routing input 120 or in user-supplied weights for individual metrics of a pre-defined cost function used by the GROS 110. A metric is a statistical feature of the results of globally routing the wiring layout. Examples of metrics include, but are not limited to: a level of congestion of the wires, a length of the wires, a timing quality of the wiring layout, the power consumption of the routing, a number of through-silicon vias (TSV) used in the wiring layout, an ease of manufacturing of the wiring layout, etc.

To produce the best wiring layout for the user, in one embodiment, the GROS 110 runs several analyses of candidate wiring layouts according to different atoms or molecules in a parameter set in parallel with one another, and uses the results of the parallel analysis to update the parameter set with new molecules (based on the previously analyzed atoms and/or molecules) and the best performing atoms and/or molecules from the current parameter set. The GROS 110 will run for several iterations, until an iteration count specified in the routing input 120 is satisfied, analyzing several wiring layouts in parallel associated with atoms/molecules in the parameter set and updating the parameter set with each iteration according to the costs determined for each atom/molecule's associated wiring layout.

The GROS 110 includes a molecule predictor 112 to generate and select new molecules from the supplied atoms initially specified for use in the routing input 120 from the atom library 130 and, in later iterations, to generate additional molecules from atoms and/or molecules used in prior iterations of generating candidate wiring layouts and select which to include in the parameter set based on the predicted costs of the associated molecules. As described in greater detail in regard to FIGS. 2A and 2B, in one embodiment, each molecule created for use in the parameter set is unique from the other molecules created for use in the parameter set.

In various aspects, the number of atoms or molecules that may be combined into new molecules for the next iteration may be set via a compound count. For example, with a compound count of three (3), no more than three atoms or molecules from the current iteration's parameter set may be combined to make additional molecules for the next iteration's parameter set. In this example, a molecule in the next iteration's parameter set may include one atom/molecule from the current iteration's parameter set, a combination of two atoms/molecules from the current iteration's parameter set, or a combination of three atoms/molecules from the current iteration's parameter set. In some aspects, the routing input 120 may specify that certain atoms or molecules are always included in each iteration's parameter set. In other aspects, the routing input 120 may specify that each iteration's parameter set is to be comprised of atoms or molecules that are unique from the atoms or molecules used in any prior iteration's parameter set.

Additionally, the number of molecules or atoms in the parameter set may be limited by the user in the routing input 120 to not exceed a predefined number (referred to herein as a size constraint or k). In some aspects, k remains constant throughout the iterations, while in other aspects, k may increase or decrease as the number of iterations increases. When the number of new molecules created by the molecule predictor 112 exceeds k, the molecule predictor 112 may select the k molecules that will be used in the updated parameter set for the next iteration based on the predicted costs for the molecules, where the k-best molecules are selected for further analysis in the next iteration.

The GROS 110 includes a multi-thread global router 114 that is operable to create up-to k different wiring layouts for the integrated circuit specified in the netlist. Each of the up-to k routing jobs that produce wiring layouts are performed by the multi-thread global router 114 in parallel with one another. Each routing job is associated with one atom or molecule included in the parameter set for the current iteration, which results in up-to k different wiring layouts for the integrated circuit being produced for each iteration.

The up-to k different wiring layouts produced by the multi-thread global router 114 are monitored by a result monitor 116 included in the GROS 110 according to the various metrics specified in the routing input 120. In some aspects, the metrics are determined during the routing job, while in other aspects the result monitor 116 waits to collect some or all of the metrics until the routing job has completed.

The values for the metrics determined by the result monitor 116 for each routing job associated with an atom/molecule are accessed by a cost analyzer 118 of the GROS 110. The cost analyzer 118 analyzes the metrics according to the user-supplied cost function or user-supplied weightings for individual metrics via a system-defined cost function. The cost calculated for each wiring layout (and the associated atom/molecule) may be archived. The calculated costs are also fed to the molecule predictor 112 to inform the creation and selection of the up-to k atoms/molecules analyzed in the next iteration. For example, the molecule predictor 112 may update a machine learning algorithm that is used to predict the costs of various molecules based on the difference between a predicted cost for a molecule and a measured cost for the same molecule.

Once the iteration count has been satisfied, the GROS 110 selects the best wiring layout, and the associated atom or molecule, according to the cost calculated by the cost analyzer 118. In some aspects, the best wiring layout is selected as the wiring layout produced by the atom/molecule of the current parameter set (once the iteration count has been satisfied) with the lowest calculated cost. In other aspects, the archived costs of various wiring layouts are searched to find the wiring layout and associated atom/molecule that is associated with the lowest calculated cost.

The selected best wiring layout and/or the best parameter atom/molecule may be sent to a detail routing system to produce further a detailed wiring layout for the integrated circuit, which may modify and/or build from the wiring layout produced by the GROS 110. The integrated circuit may then be fabricated according to the netlist and the detailed wiring layout based on the best global wiring layout. As will be appreciated, by supplying the detail routing system with an optimized global wiring layout as described herein, the effect and time needed for detail routing is reduced (e.g., number of changes from the global wiring layout is reduced), the combined time and processing resources needed for global and detail routing is reduced, and the quality of the results are also improved.

Each of the molecule predictor 112, multi-thread global router 114, result monitor 116, and cost analyzer 118 may be implemented on one computing device used as part of the GROS 110, via hardware components thereof or via software components thereof. In addition or alternatively, each of the molecule predictor 112, multi-thread global router 114, result monitor 116, and cost analyzer 118 may be provided on dedicated computing devices that are communicated via a network to provide the GROS 110 as a distributed system.

Figure 2A:
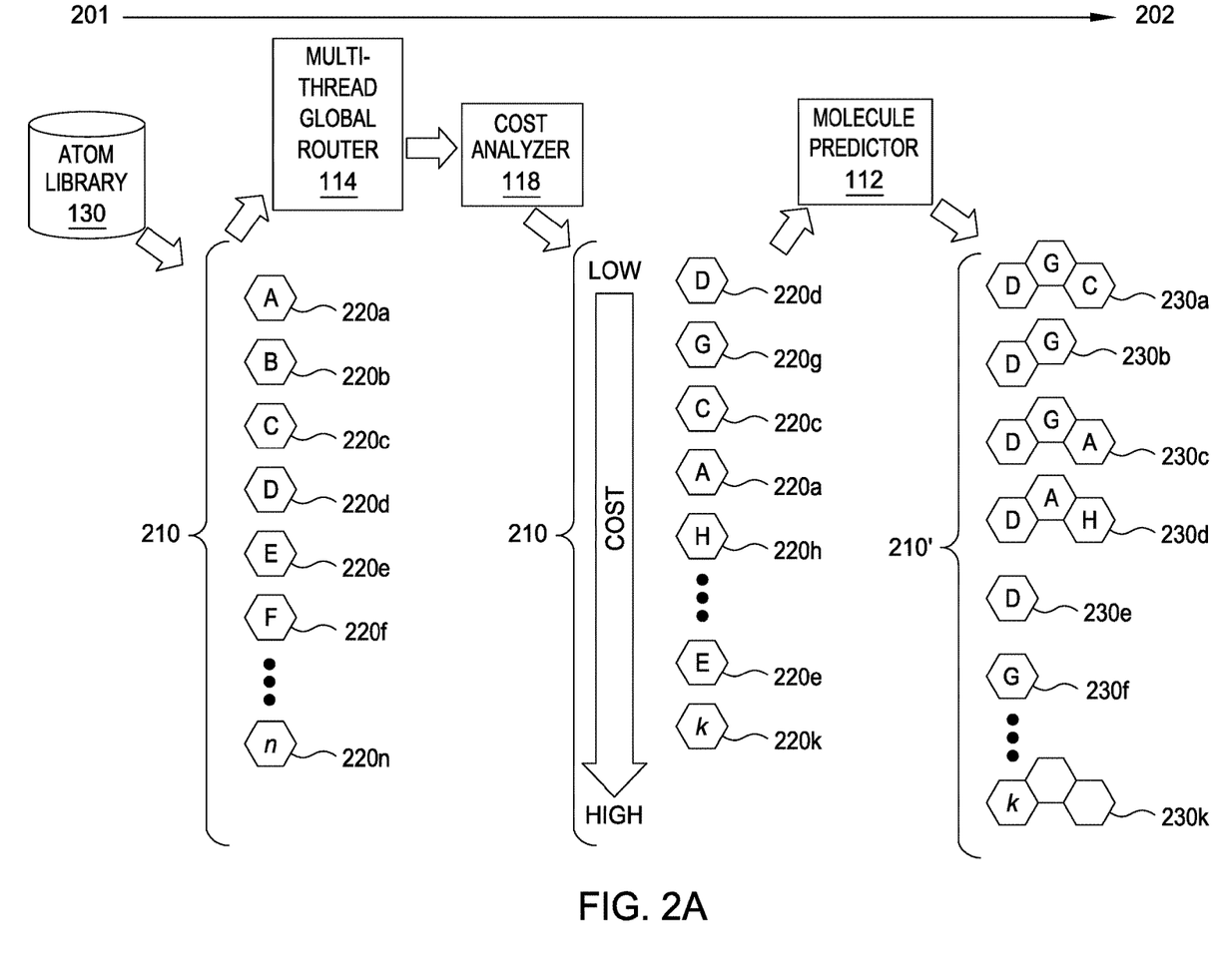
FIGS. 2A and 2B illustrate an example of the construction and updating of a parameter set across multiple iterations, in accordance with certain aspects of the present disclosure.
Figure 2B:
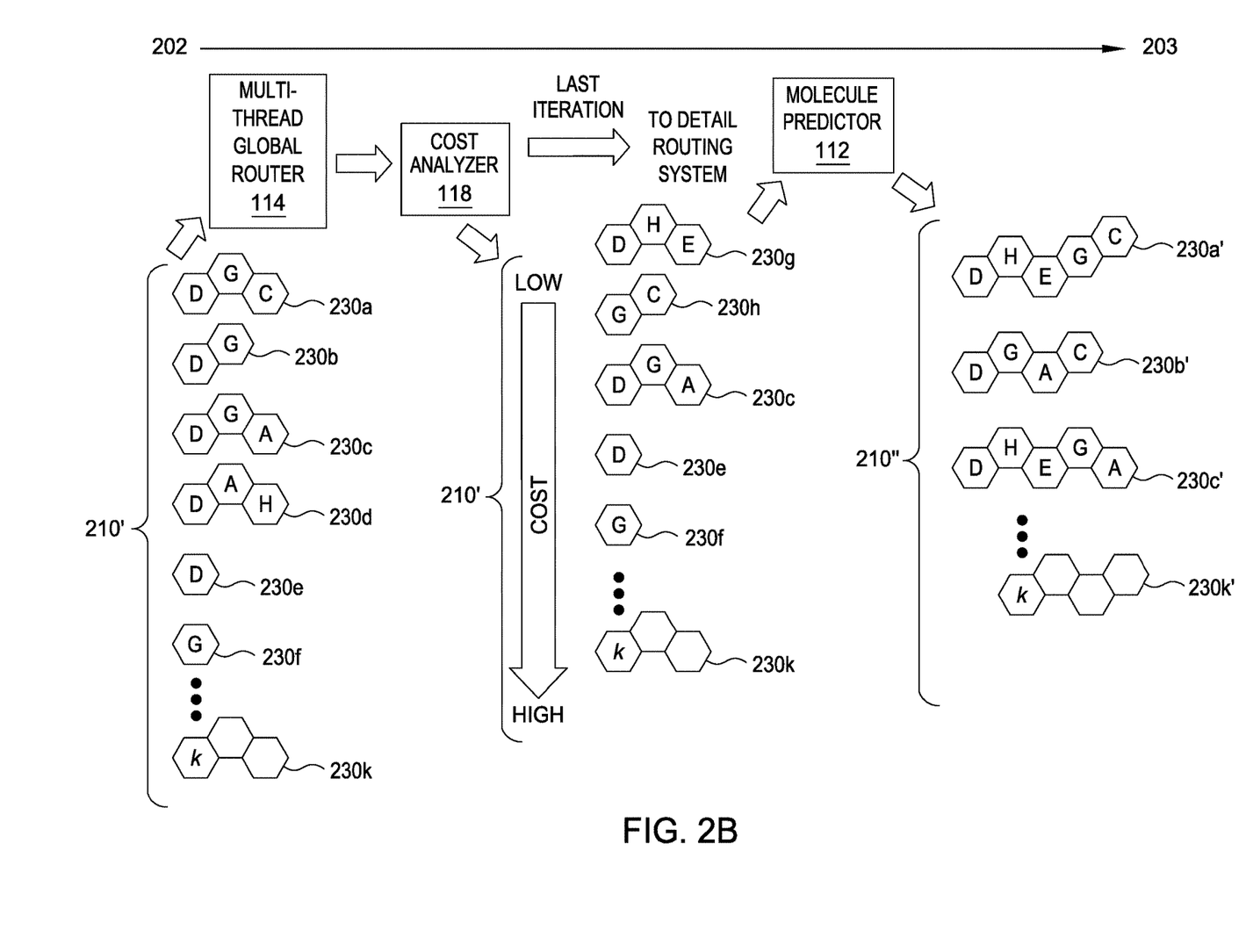

FIGS. 2A and 2B illustrate an example of the construction and updating of a parameter set across multiple iterations executed by the GROS 110 according to the present disclosure. FIG. 2A illustrates the parameter set for the initial iteration 201 leading into a second iteration 202 and FIG. 2B illustrates a continuation from FIG. 2A in which the parameter set for the second iteration 202 leads into a third iteration 203. Although a given number of iterations are shown, using a set number of example atoms and molecules, one of ordinary skill in the art will appreciate that more iterations than illustrated using more or fewer atoms and molecules in their respective parameter sets are envisioned.

As shown in FIG. 2A, the examples of an initial iteration 201 of global routing according to the present disclosure starts on the left side of the illustration and proceeds rightward. At the beginning of the initial iteration 201, the atom library 130 is accessed, and a parameter set 210 is created from atoms 220a-k (generally, atom 220). The number of atoms 220a-k comprising the parameter set 210 is set according to the size constraint k. Users choose atoms 220 from the atom library 130, which may include several pre-defined groupings of atoms 220 for selection organized according to various classifications of those atoms 220. For example, a user may select individual atoms 220, a pre-defined group of atoms 220 associated with a low-power classification, a second pre-defined group of atoms 220 associated with a high performance classification, and other pre-defined groups of atoms 220 associated with other classifications. The number of atoms 220 initially selected from the atom library 130 may be greater than k, such that n atoms 220a-n are selected from the atom library 130 (where n>k). The multi-thread global router 114 selects k atoms 220 from the initial parameter set and creates k individual wiring layouts, each associated with one atom 220a-k of the plurality of atoms comprising the parameter set 210 in the initial iteration 201.

The cost analyzer 118 ranks the individual atoms 220a-k based on the cost of routing for the wiring layout associated with the individual atom 220a-k. These ranked atoms 220a-k are in turn used by the molecule predictor 112 to generate and select molecules 230a-k (generally, molecule 230) to update the parameter set 210 for use in the subsequent iteration. The number of molecules 230a-k selected to update the parameter set 210 is also controlled by the size constraint k, and the number of atoms that may comprise one of the molecules 230 is defined to be between one (1) and a compound constraint threshold. For example, with a compound count threshold set to three (3), no molecule for the second iteration 202 would be created that was made of more than three atoms, but molecules made of one, two, or three atoms are possible.

The molecule predictor 112, using the associated costs, creates the molecules 230 to form the parameter set 210 that it predicts will lead to the lowest cost wiring layouts in the next iteration of global routing. As will be appreciated, a number of molecules 230 generated from the atoms 220 may exceed k, and the k molecules 230 that the molecule predictor 112 believes will perform best in the subsequent iteration will be selected to update the parameter set 210. In some embodiments, the molecule predictor 112 uses a machine learning technique that maps the costs associated with the atoms 220 (and the compounded molecules 230 made from those atoms 220 in later iterations) within a space that uses the identities of the atoms 220 as coordinates that are labeled by the costs of routing of the associated wiring layouts. The molecule predictor 112 uses the space, as updated across the series of iterations to predict the k molecules 230a-k that will provide the best performance (i.e., be associated with the lowest costs) in the next iteration. Generally, the molecule predictor 112 prioritizes the use of the atoms 220a-k that are associated with the lowest costs of routing when determining how to create the molecules 230a-k. In the illustrated example, atom 220d and atom 220g are associated with wiring layouts having the lowest and second lowest cost of routing respectively, and atom 220e and atom 220k are associated with wiring layouts having the second highest and highest cost of routing respectively. The molecule predictor 112 in this example prioritizes the use of atom 220d over other atoms (such as atom 220g, 220e, and 220k) that are associated with higher costs when creating the molecules 230a-k. However, based on the space analysis of the costs associated with the atoms 220a-k, the molecule predictor 112 may not exhaust all the unique valid molecules that use atom 220d before creating molecules 230 that do not include atom 220d for inclusion in the parameter set 210 as updated.

In one embodiment, the molecule predictor 112 ensures that each molecule 230a-k in the parameter set 210 is unique from the other molecules in the parameter set 210. Although illustrated in an ordered arrangement, it will be appreciated that the order of atoms in a molecule does not affect the GROS 110 of the present disclosure. Stated differently, the molecule D-G-C (comprised of the fourth atom 220d, the seventh atom 220g, and the third atom 200c) is the same as the molecule C-D-G (also comprised of the fourth atom 220d, the seventh atom 220g, and the third atom 200c), and the parameter set 210 only includes one molecule 230 that includes the same set of atoms 220.

Additionally, the molecule predictor 112 may ensure that each molecule 230 that it creates is valid. For example, if the first atom 220a were to include a parameter stating "X" (e.g., the maximum number of TSVs is seven), and the fifth atom 220e were to include a parameter stating "not X" (e.g., the maximum number of TSVs is nine, the minimum number of TSVs is eight, etc.), the molecule predictor 112 would not create a molecule 230 that includes both the first atom 220a and the fifth atom 220e, as such a molecule 230 would be invalid. In another example, if the first atom 220a were to include a parameter stating "X" (e.g., the maximum number of TSVs is seven), and the fifth atom 220e were to include a parameter stating "Y" (e.g., the minimum straight run length of a wire is 10 nm), the molecule predictor 112 could create a molecule 230 that includes both the first atom 220a and fifth atom 220e. In a further example, if the first atom 220a were to include a parameter stating "X and Z" (e.g., the maximum number of TSVs is seven and the maximum proximity between wires is 5 nm), and the fifth atom 220e were to include a parameter stating "X and Y" (e.g., the maximum number of TSVs is seven and the minimum straight run length of a wire is 10 nm), the molecule predictor 112 could create a molecule 230 that includes both the first atom 220a and the fifth atom 220e.

Turning now to FIG. 2B, the parameter set 210 as updated from the initial iteration 201 is used as the parameter set 210 for the second iteration 202 leading into a third iteration 203. Although discussed in terms of a second iteration 202 and a third iteration 203 in the illustrated example, it will be appreciated that the discussion related to FIG. 2B is applicable to any iteration of a series of iterations after the initial iteration 201.

Similarly to the initial iteration 201, and as will be used in subsequent iterations, the second iteration 202 receives an updated parameter set 210 comprised of molecules 230a-k that are based on the molecules 230 and atoms 220 from the previous iteration that are predicted to perform best in the current iteration. The multi-thread global router 114 processes each of the molecules 230a-k in parallel to produce a plurality of wiring layouts, wherein each wiring layout is associated with one of the molecules 230a-k in the parameter set 210. The cost analyzer 118 then ranks the molecules 230a-k based on the cost of routing associated with the wiring layout associated with each molecule 230a-k.

When it is determined that an additional iteration is to be performed (e.g., an iteration count has not been satisfied), the cost analyzer 118 passes the ranked molecules 230a-k to the molecule predictor 112 to update the parameter set 210 for the next iteration. When it is determined that an additional iteration is not to be performed (e.g., an iteration count has been satisfied), the cost analyzer 118 passes the best molecule of the ranked molecules 230a-k (i.e., the molecule 230 associated with wiring layout having the lowest cost of routing) and/or the wiring layout produced according to the best molecule to a detail routing system to produce a detailed wiring layout for the given circuit based on the global wiring layout produced by the best molecule by the multi-thread global router 114. The circuit may then be fabricated according to the detail wiring layout based on the best global wiring layout.

As the measured cost of routing for each wiring layout may differ from the predicted cost of routing that wiring layout's associated molecule 230a-k, the machine learning algorithms and weightings used by the molecule predictor 112 may be updated for use in subsequent iterations. In the illustrated example, a first molecule 230a (D-G-C) was predicted to have the lowest cost, but a seventh molecule 230g (D-H-E) was measured to have the lowest cost within the parameter set 210. The molecule predictor 112 can update its machine learning algorithm to better inform its predictions based on the observed differences between the predicted and actual costs of routing for the given circuit when generating and selecting new molecules 230a-k' (generally, new molecule 230') for the next iteration. In the next iteration (e.g., the third iteration 203 relative to the second iteration 202) the new molecules 230a-k' are treated as the molecules 230a-k illustrated in FIG. 2B.

The new molecules 230' that are generated for the parameter set 210 for the next iteration (e.g., the third iteration 203) follow the same rules of construction generally outlined for the initial iteration 201 leading into the second iteration 202. In one embodiment, the rules of construction define that: the number of molecules 230a-k that are used to construct the new molecules 230' are defined by a compound count threshold, the number of new molecules 230a-k' that are selected will not exceed the size constraint k, each new molecule 230' is unique within the parameter set 210', and each new molecule 230' includes a valid set of atoms 220. Additional rules of construction that are used in various embodiments may specify that the size constraint k may increase or decrease as the iteration count increases, that a compound count threshold varies across iterations, or that a specific atom 220 or molecule 230 be retained in the parameter set 210 across iterations, although other additional rules are possible.

As illustrated in FIG. 2B, the first new molecule 230a' (D-H-E-G-C) is comprised of the seventh molecule 230g (D-H-E) and eighth molecule 230h (G-C) from the current iteration's parameter set 210'. The second new molecule 230a' (D-G-A-C) is illustrated as the combination of the third molecule 230c (D-G-A) and eighth molecule 230h (G-C) from the current iteration's parameter set 210'; overlaying repeated atoms (e.g., seventh atom 220g (G)) between the two or more combined molecules 230a-k. The molecule predictor 112 selects the new molecules 230a-k' that are produced from the molecule 230a-k based on which of the new molecules 230' are predicted to be the k best molecules. As will be appreciated, the molecule predictor 112 may generate more than k new molecules 230, but may only select up to the k that it predicts will perform best in the next iteration for inclusion in the parameter set 210". As will also be appreciated, if the number of unique and valid new molecules 230' generated is less than k, the molecule predictor 112 may include all of the generated new molecules 230' (or may include all of the new molecules 230' that have a predicted cost of routing below a cost threshold) in the parameter set 210", and the GROS 110 will operate with fewer than k molecules 230 in the next iteration.

Figure 3:
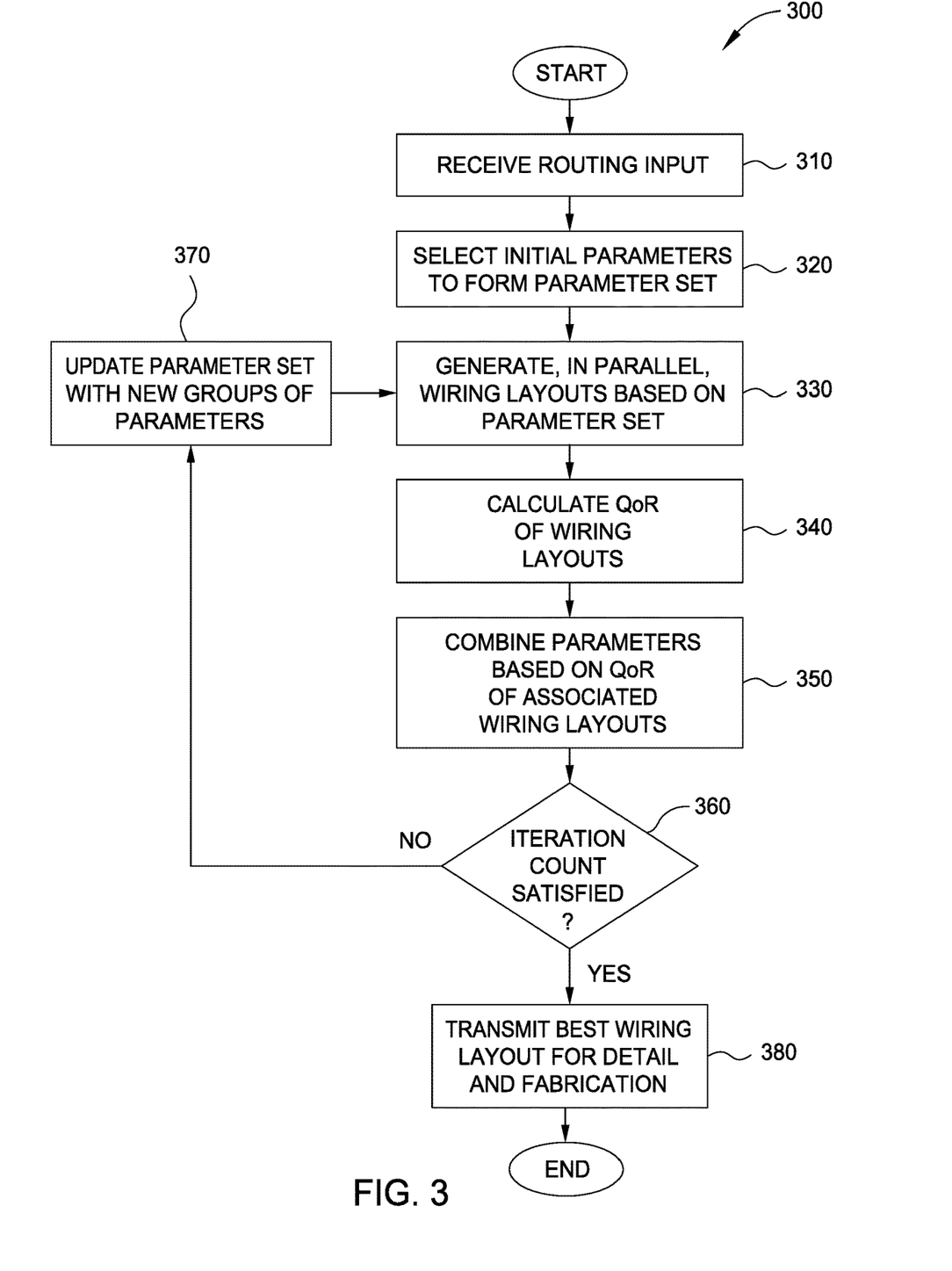
FIG. 3 is flowchart illustrating example steps in a method for global route optimization, in accordance with certain aspects of the present disclosure.

FIG. 3 is a flowchart illustrating example steps in a method 300 for global route optimization. Method 300 begins at block 310, where the routing input 120 is received. The routing input 120 include various control parameters, a netlist for a given integrated circuit to optimize, identifiers for various parameter atoms, values/weights for a cost function, a compound count threshold, a size constraint k for the parameter set, and a number of iterations for use in globally routing the given integrated circuit.

At block 320, the parameter set is formed for the initial iteration from various selected atoms. These selected atoms may be are indicated by the user in the routing input 120, and are retrieved from an atom library 130. The parameter atoms selected from the atom library 130 define a first parameter set that is used to optimize the global wiring layout of the integrated circuit. The atoms can be used singly and in combination, as molecules, in the initial and later iterations to define various parameters for use in routing the integrated circuit. As method 300 iterates or repeats, the parameter set is updated for each iteration with permutations of the atoms and/or molecules contained in the parameter set. For each iteration of a series of iterations, method 300 updates the parameter set with new molecules (or the best "survivor" molecules from the prior parameter set), determines the cost of routing for the parameter molecules, and determines whether an additional iteration is required.

In an initial iteration of method 300, at block 330 the parameter atoms are used to create several different wiring layouts of the integrated circuit. In subsequent iterations of method 300, at block 330 the molecules and/or atoms that comprise the parameter set as updated are used to create several different wiring layouts of the integrated circuit. Each of the global routing jobs is associated with an individual atom or molecule, and all of the global routing jobs for a given iteration are executed in parallel by a multi-thread global router 114 of the GROS 110. The number of atoms or molecules in the parameter set (i.e., up-to the size constraint k) directly corresponds to the number of routing jobs that are run in parallel. By running the routing jobs in parallel across several iterations, the number of routing job threads that the multi-thread global router 114 needs to run may be limited to no more than k threads, and memory space requirements are thereby reduced by using several iterations of up-to k threads. In some embodiments, the number or processors or cores available to run global routing jobs determines the size constraint k.

The global wiring layouts created based on the molecules and/or atoms in the parameter set are evaluated in parallel at block 340 to calculate the Quality of Result (QoR) measure (e.g., cost) for globally routing the integrated circuit as defined by each molecule and/or atom. The QoR measure is calculated according to a user-defined cost function and/or user-defined weights of various metrics used in a cost function that are defined in the routing input 120. The QoR measures may be archived or saved for later analysis or selection, but are also used to determine new or additional molecules for analysis in later iterations. In various embodiments, differences between predicted and measured QoR measures are used by the molecule predictor 112 to update a machine learning algorithm to better select molecules to produce lower-cost global wiring layouts.

In one embodiment, the cost (e.g., a QoR measure) is calculated according to the formula of $w_1m_1+w_2m_2+w_3m_3+w_4m_4$, where $w_1$, $w_2$, $w_3$, and $w_4$ are user defined weights for the metrics $m_1$, $m_2$, $m_3$, and $m_4$, and where $m_1$, $m_2$, $m_3$, and $m_4$ are metrics of each global route measured by the cost analyzer 116 to represent the congestion of the wiring within the routing, the timing quality of the wiring layout, power consumption of the wiring layout, and the number of TSVs used in the wiring layout. Although four metrics and their associated weights are given in the preceding example, it will be understood that more or fewer metrics and weights may be used in different embodiments using more and different metrics.

The calculated costs for the wiring layouts are used at block 350 to create additional molecules based on the calculated costs for the associated wiring layouts constructed based the atoms/molecule of the current iteration's parameter set. The molecules associated with the wiring layouts calculated to have the lowest cost are prioritized for combination for use as new molecules in the next iteration's parameter set. The molecule predictor 112 analyzes the available molecules in the parameter set and determines which combinations thereof (up to the compound constraint threshold) are valid constructions (e.g., no conflicting parameter definitions in included atoms or no atom is included more than once). For example, with a compound constraint of two and an initial parameter set of atoms A, B, C, and D, in which A and D specify conflicting parameters, the molecule predictor 112 may generate candidate molecules of: A, B, C, D, A-B, A-C, B-C, B-D, and C-D. Combinations such as B-A that have an equivalent (i.e., A-B) or such as A-B-C that exceed the compound constraint threshold are not be generated. Similarly, combinations are not generated that include both A and D, as such a construction would be invalid due to A and D specifying conflicting parameters (e.g., a given measurement for how to route the circuit is X for A and Y for D, where X≠Y).

From the valid combinations of candidate molecules generated, the molecule predictor 112 selects up-to k candidate molecules that are expected to have the lowest costs of routing in the next iteration. Continuing the above example, the molecule predictor 112, based on prior measurements of the costs associated with the component atoms and molecules used to generate the candidate molecules, estimates a predicted cost for each of the candidate molecules, and select the k-best for use as the new molecules in the updated parameter set. Assume that k in the above example is set to four, and the associated predicted costs are as follows: A(7), B(6), C(12), D(3), A-B(5), A-C(15), B-C (3), B-D(2), and C-D(18). In this example, the k-best candidate molecules would be B-D, B-C, D, and A-C, because these are the four (k=4) generated candidate molecules having the lowest predicted costs of routing.

At block 360 it is determined whether an iteration count for method 300 is satisfied. As will be appreciated, global routing may take several iterations to produce a "best" wiring layout for an integrated circuit. An iteration count is updated (e.g., incremented) for each iteration so that method 300 iterates, performing blocks 330-370, until the iteration count is satisfied.

Method 300 proceeds to block 370 from block 360 when it is determined that the iteration count has not been satisfied. The parameter set is updated at block 370 for the next iteration based on the costs determined for the atoms/molecules in the current iteration. In various aspects, a number of atoms/molecules in the current iteration's parameter set are combined to form the atoms/molecules that will comprise the next iteration's parameter set. The number of atoms/molecules that can be combined may be set by a compound count threshold, and the number of atoms/molecules to produce or include in the next iteration's parameter set may be set by a size constraint (i.e., k). The k-best molecules are selected for inclusion in the parameter set for the next iteration, and method 300 proceeds to block 330 to begin the next iteration with the updated parameter set.

In some embodiments, method 300 proceeds from block 340 to block 360, and performs block 350 in response to determining that the iteration count has not been satisfied. In such embodiments, method 300 proceeds from block 350 to block 370.

Method 300 proceeds to block 380 from block 360 when it is determined that the iteration count has been satisfied. At block 380, the best molecule of the parameter set and/or the associated best wiring layout is transmitted to a detail routing system. In some aspects, the best wiring layout is based on the parameter molecule in the final iteration's parameter set having a lowest cost according to the cost function. In other aspects, best wiring layout is based on the parameter molecule across all of the iterations having the lowest cost according to the cost function and archived/saved values from all of the iterations. The best wiring layout, its associated atom/molecule, and the netlist are used to produce a detailed wiring layout for the given circuit, which is then used to fabricate the integrated circuit. Method 300 may then conclude.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A method for optimizing global routing of a circuit, the method comprising:
   generating, in parallel, a plurality of candidate wiring layouts for an integrated circuit, wherein each candidate wiring layout of the plurality of candidate wiring layouts corresponds to a respective parameter super-group of a plurality of parameter super-groups, wherein the plurality of parameter super-groups form a parameter set;
   calculating a Quality of Result (QoR) measure for each candidate wiring layout of the plurality of candidate wiring layouts based on metrics associated with said each candidate wiring layout;

in response to determining to perform a subsequent iteration of a series of iterations:
updating the parameter set by combining selected parameter super-groups of the plurality of parameter super-groups, based on the QoR measure, to form a plurality of new parameter super-groups; and
generating, in parallel, a plurality of new candidate wiring layouts for the integrated circuit, wherein each new candidate wiring layout of the plurality of new candidate wiring layouts corresponds to a respective new parameter super-group of the plurality of new parameter super-groups;
calculating a new QoR measure for said each new candidate wiring layout of the plurality of new candidate wiring layouts based on metrics associated with each new candidate wiring layout; and
in response to determining to not perform any further iterations:
determining a best parameter super-group from the parameter set based on the new QoR measure calculated for the plurality of new candidate wiring layouts; and
transmitting a new candidate wiring layout associated with the best parameter super-group to a detail routing system.

2. The method of claim 1, further comprising:
receiving a detailed wiring layout for the integrated circuit from the detail routing system based on the new candidate wiring layout associated with the best parameter super-group; and
fabricating the integrated circuit according to the detailed wiring layout.

3. The method of claim 1, further comprising, for an initial iteration of the series of iterations:
receiving routing input from a user identifying a plurality of parameter groups;
retrieving the plurality of parameter groups from an atom library to form the parameter set;
generating, in parallel, a plurality of initial candidate wiring layouts for the integrated circuit according to the plurality of parameter groups, wherein each initial candidate wiring layout of the plurality of initial candidate wiring layouts is associated with a respective parameter group of the plurality of parameter groups;
calculating the QoR measure for said each initial candidate wiring layout based on metrics associated with each initial candidate wiring layout;
combining the plurality of parameter groups into the plurality of parameter super-groups based on the QoR measure calculated for each initial candidate wiring layout for the associated parameter group; and
updating the parameter set with the plurality of parameter super-groups.

4. The method of claim 3, wherein the routing input further comprises weightings for the metrics by which the QoR measure for each candidate wiring layout is calculated.

5. The method of claim 3, wherein the routing input further comprises a compound count threshold, defining a maximum number of parameter groups and parameter super-groups from which each new parameter super-group is created for a given iteration.

6. The method of claim 3, wherein the routing input further comprises a size constraint, defining a maximum number of parameter super-groups in the plurality of parameter super-groups that comprise the parameter set for a given iteration.

7. The method of claim 1, wherein parameters that comprise the plurality of parameter super-groups include at least one of:
a minimum number of through silicon vias (TSVs);
a minimum proximity of a wire to an element or a component;
a minimum proximity of a first wire to a second wire;
a minimum thickness of a wire;
a minimum length of a wire;
a minimum length for a straight run of a wire;
a minimum number of layers a wire can pass through;
a maximum number of TSVs;
a maximum proximity of a wire to an element or a component;
a maximum proximity of a first wire to a second wire;
a maximum thickness of a wire;
a maximum length of a wire;
a maximum length for a straight run of a wire; and
a maximum number of layers a wire can pass through.

8. The method of claim 1, wherein the metrics include measures for a given candidate wiring layout of at least one of:
a level of congestion of wires in the given candidate wiring layout;
a length of wires in the given candidate wiring layout;
a timing quality of the given candidate wiring layout;
a power consumption of the given candidate wiring layout
a number of through-silicon vias (TSVs) used in the given candidate wiring layout; and
an ease of manufacturing of the given candidate wiring layout.

9. The method of claim 1, wherein updating the parameter set further comprises:
generating a plurality of candidate parameter super-groups, wherein each candidate parameter super-group includes at least one parameter super-group;
generating a predicted QoR measure for each candidate parameter super-group based on the calculated QoR measure of each parameter super-group of the at least one parameter super-group included in the candidate parameter super-group; and
selecting a subset of the candidate parameter super-groups of the plurality of candidate parameter super-groups as the plurality of new parameter super-groups based on the predicted QoR measure associated with each candidate parameter super-group of the plurality of candidate parameter super-groups.

10. The method of claim 9, wherein the updating the parameter set further comprises:
determining a difference between the predicted QoR measure and the calculated QoR measure for each parameter super-group; and
updating a machine learning algorithm used to calculate the predicted QoR measure for each candidate parameter super-group based on the difference.

11. A system for optimizing global routing of a circuit, comprising:
one or more computer processors; and
a non-transitory computer-readable storage medium having computer-readable program code embodied therewith, the computer-readable program code executable by the one or more computer processors to:
generate, in parallel, a plurality of candidate wiring layouts for an integrated circuit, wherein each candidate wiring layout of the plurality of candidate wiring layouts corresponds to a respective parameter super-group of a plurality of parameter super-groups, wherein the plurality of parameter super-groups form a parameter set;

calculate a Quality of Result (QoR) measure for each candidate wiring layout of the plurality of candidate wiring layouts based on metrics associated with said each candidate wiring layout;

in response to determining to perform a subsequent iteration of a series of iterations:

update the parameter set by combining selected parameter super-groups of the plurality of parameter super-groups, based on the QoR measure, to form a plurality of new parameter super-groups; and generate, in parallel, a plurality of new candidate wiring layouts for the integrated circuit, wherein each new candidate wiring layout of the plurality of new candidate wiring layouts corresponds to a respective new parameter super-group of the plurality of new parameter super-groups;

calculate a new QoR measure for each new candidate wiring layout of the plurality of new candidate wiring layouts based on metrics associated with said each new candidate wiring layout; and in response to determining to not perform any further iterations:

determine a best parameter super-group from the parameter set based on the new QoR measure calculated for the plurality of new candidate wiring layouts; and transmit a new wiring layout associated with the best parameter super-group to a detail routing system.

12. The system of claim 11, wherein the computer-readable program code is further executable to, in response to determining to not perform any further iterations:

receive a detailed wiring layout from the detail routing system based on the new candidate wiring layout associated with the best parameter super-group; and fabricate the integrated circuit according to the detailed wiring layout.

13. The system of claim 11, wherein the computer-readable program code is further executable to, for an initial iteration of the series of iterations:

receive routing input from a user identifying a plurality of parameter groups;

retrieve the plurality of parameter groups from an atom library to form the parameter set;

generate, in parallel, a plurality of initial candidate wiring layouts for the integrated circuit according to the plurality of parameter groups, wherein each initial candidate wiring layout of the plurality of initial wiring layouts is associated with a respective parameter group of the plurality of parameter groups;

calculate the QoR measure for each initial candidate wiring layout based on metrics associated with said each initial candidate wiring layout;

combine the plurality of parameter groups into the plurality of parameter super-groups based on the QoR measure calculated for each initial candidate wiring layout for the associated parameter group; and update the parameter set with the plurality of parameter super-groups.

14. The system of claim 13, wherein the routing input received from the user defines:

a compound count threshold, defining a maximum number of parameter groups and parameter super-groups from which each new parameter super-group is created for a given iteration.

15. The system of claim 11, wherein to update the parameter set the computer-readable program code is further executable to:

generate a plurality of candidate parameter super-groups, wherein each candidate parameter super-group includes at least one parameter super-group;

generate a predicted QoR measure for each candidate parameter super-group based on the calculated QoR measure of each of the at least one parameter super-group included in the candidate parameter super-group; and select a subset of the candidate parameter super-groups of the plurality of candidate parameter super-groups as the plurality of new parameter super-groups based on the predicted QoR measure associated with each candidate parameter super-group of the plurality of candidate parameter super-groups.

16. A computer program product for optimizing global routing of a circuit, the computer program product comprising:

a non-transitory computer-readable storage medium having computer-readable program code embodied therewith, the computer-readable program code executable by one or more computer processors to:

generate, in parallel, a plurality of candidate wiring layouts for an integrated circuit, wherein each candidate wiring layout of the plurality of candidate wiring layouts corresponds to a respective parameter super-group of a plurality of parameter super-groups, wherein the plurality of parameter super-groups form a parameter set;

calculate a Quality of Result (QoR) measure for each candidate wiring layout of the plurality of candidate wiring layouts based on metrics associated with said each candidate wiring layout;

in response to determining to perform a subsequent iteration:

update the parameter set by combining selected parameter super-groups of the plurality or parameter super-groups, based on the QoR measure, to form a plurality of new parameter super-groups; and generate, in parallel, a plurality of new candidate wiring layouts for the integrated circuit, wherein each new candidate wiring layout of the plurality of new candidate wiring layouts corresponds to a respective new parameter super-group of the plurality of new parameter super-groups;

calculate a new QoR measure for each new candidate wiring layout of the plurality of new candidate wiring layouts based on metrics associated with said each new candidate wiring layout; and in response to determining to not perform any further iterations:

determine a best parameter super-group from the parameter set based on the new QoR measure calculated for the plurality of new candidate wiring layouts; and transmit a new candidate wiring layout associated with the best parameter super-group to a detail routing system.

17. The computer program product of claim 16, wherein the computer-readable program code is further executable to, in response to determining to not perform any further iterations:
- receive a detailed wiring layout from the detail routing system based on the new candidate wiring layout associated with the best parameter super-group; and
- fabricate the integrated circuit according to the detailed wiring layout.

18. The computer program product of claim 16, wherein the computer-readable program code is further executable to, for an initial iteration of the series of iterations:
- receive routing input from a user identifying a plurality of parameter groups;
- retrieve the plurality of parameter groups from an atom library to form the parameter set;
- generate, in parallel, a plurality of initial candidate wiring layouts for the integrated circuit according to the plurality of parameter groups, wherein each initial candidate wiring layout of the plurality of initial candidate wiring layouts is associated with a respective parameter group of the plurality of parameter groups;
- calculate the QoR measure for each initial candidate wiring layout based on metrics associated with said each initial candidate wiring layout;
- combine the plurality of parameter groups into the plurality of parameter super-groups based on the QoR measure calculated for each initial candidate wiring layout for the associated parameter group; and
- update the parameter set with the plurality of parameter super-groups.

19. The computer program product of claim 18, wherein the routing input received from a user defines:
- a size constraint, defining a maximum number of parameter super-groups in the plurality of parameter super-groups that comprise the parameter set for a given iteration.

20. The computer program product of claim 16, wherein to update the parameter set, the computer-readable program code is further executable to:
- generate a plurality of candidate parameter super-groups, wherein each candidate parameter super-group includes at least one parameter super-group;
- generate a predicted QoR measure for each candidate parameter super-group based on the calculated QoR measure of each parameter super-group of the at least one parameter super-group included in the candidate parameter super-group; and
- select a subset of the candidate parameter super-groups of the plurality of candidate parameter super-groups as the plurality of new parameter super-groups based on the predicted QoR measure associated with each candidate parameter super-group of the plurality of candidate parameter super-groups.

* * * * *